United States Patent
Wun-Fogle et al.

(10) Patent No.: US 6,176,943 B1
(45) Date of Patent: Jan. 23, 2001

(54) PROCESSING TREATMENT OF AMORPHOUS MAGNETOSTRICTIVE WIRES

(75) Inventors: Marilyn Wun-Fogle, Gaithersburg; James B. Restorff, College Park; Arthur E. Clark, Adelphi, all of MD (US)

(73) Assignee: The United States of America as represented by the Secretary of the Navy, Washington, DC (US)

( * ) Notice: Under 35 U.S.C. 154(b), the term of this patent shall be extended for 0 days.

(21) Appl. No.: 09/238,890

(22) Filed: Jan. 28, 1999

(51) Int. Cl.$^7$ .................................................. H01F 1/14
(52) U.S. Cl. .................................... 148/108; 148/121
(58) Field of Search ............................ 148/108, 121, 148/103

(56) References Cited

U.S. PATENT DOCUMENTS

| | | |
|---|---|---|
| 2,829,047 | 4/1958 | Round et al. . |
| 3,774,134 | 11/1973 | Kardashian et al. . |
| 3,882,441 | 5/1975 | Holmen et al. . |
| 3,940,992 | 3/1976 | Jost et al. . |
| 4,116,728 | 9/1978 | Becker et al. . |
| 4,249,969 | 2/1981 | DeCristofare et al. . |
| 4,268,325 | 5/1981 | O'Handley et al. . |
| 4,298,409 | 11/1981 | DeChritofaro et al. . |
| 4,314,594 | 2/1982 | Pfeifer et al. . |
| 4,497,046 | 1/1985 | Savage . |
| 4,716,556 | 12/1987 | Raskin et al. . |
| 4,763,030 | 8/1988 | Clark et al. . |
| 4,769,091 * | 9/1988 | Yoshizawa et al. ............... 148/108 |
| 4,906,879 | 3/1990 | Clark et al. . |
| 5,039,894 | 8/1991 | Teter et al. . |
| 5,259,099 | 11/1993 | Banno et al. . |
| 5,315,881 | 5/1994 | Savage et al. . |
| 5,380,554 | 1/1995 | Ferrando . |
| 5,935,346 * | 8/1999 | Couderchon et al. ............... 148/108 |

* cited by examiner

*Primary Examiner*—John Sheehan
(74) *Attorney, Agent, or Firm*—John Forrest; Jacob Shuster

(57) ABSTRACT

A magnetostrictive wire element made of amorphous ferromagnetic material is tailored for installation within a sensor by treatment which includes annealment by heating while a stress condition is imposed thereon, and applying a DC electric current thereto during said annealment to produce a cylindrical magnetic field relative to the wire element establishing spiral magnetic anistropy during cooldown after said heating.

5 Claims, 1 Drawing Sheet

PROCESSING TREATMENT OF AMORPHOUS MAGNETOSTRICTIVE WIRES

The present invention relates generally to amorphous ferromagnetic materials utilized in sensor applications in the form of wire elements.

BACKGROUND OF THE INVENTION

Magnetostrictive materials prepared from amorphous ferromagnetic alloys may be tailored to a variety of specifically different sensor applications. Such amorphous ferromagnetic materials have been previously utilized to fabricate ribbons for transformer cores and found to be very sensitive to strains and to magnetic fields. Previous work on ribbons made from such magnetoelastic materials involved annealment thereof in a transverse magnetic field for removal of mechanical strains, resulting in a transverse anisotropy and a high magnetoelastic coupling factor, as disclosed for example in U.S. Pat. No. 4,763,030 to Clark et al.

Use of magnetostrictive material in the form of elongated wire positioned on the cylindrical surface of a shaft in a torque sensor application was also previously proposed, as disclosed in U.S. Pat. No. 5,315,881 to Savage et al. According to the latter Savage et al. patent, the magnetostrictive wire may be annealed prior to positioning on the torque sensor shaft in a magnetic field predominantly directed transverse to the wire axis. Use of such wire has several advantages over ribbons in offering better uniformity, accommodating annealment for longer lengths of the magnetostrictive element and enabling inductive magnetic anistropy to be imparted therein while it is being helically wound about the shaft by twisting to control dynamic range and sensitivity.

Previous work on magnetostrictive ribbon and wire elements as respectively disclosed in the aforementioned Clark et al. and Savage et al. patents involve transverse annealing resulting in a transverse anisotropy which does not maintain cylindrical geometry of the magnetostrictive element or circular symmetry in the case of wire. Because of the aforementioned advantages of wires over ribbons, use of wire elements provides more numerous design options for tailoring amorphous ferromagnetic materials to specific sensor applications, if circular symmetry could be maintained to obtain a high magnetoelastic coupling factor. It therefore an important object of the present invention to maintain the desired circular symmetry with respect to such wire despite its annealment so as to produce a high magnetostrictive coupling factor.

SUMMARY OF THE INVENTION

In accordance with the present invention, a magnetostrictive element made of amorphous ferromagnetic material for sensor application, is in the form of an elongated wire that is initially annealed by heating to a temperature necessary to remove stresses therein induced during manufacture of the wire. In addition to such heating of the wire, a DC electric current is applied thereto during annealment so as to produce a cylindrical magnetic field maintained in the wire during cooldown following heating. The desired cylindrical or spiral magnetic anistropy is thereby achieved.

A particular stress condition is also maintained in the wire while it is being annealed. Such stress condition is produced by applying to the wire a twist, a tensile stress or a combination of both, to a preselected degree, through separately controlled introduction of twist and tensile stress.

BRIEF DESCRIPTION OF DRAWING

A more complete appreciation of the invention and many of its attendant advantages will be readily appreciated as the same becomes better understood by reference to the following detailed description when considered in connection with the accompanying drawing wherein.

DETAILED DESCRIPTION OF PREFERRED EMBODIMENTS

Figure 1:
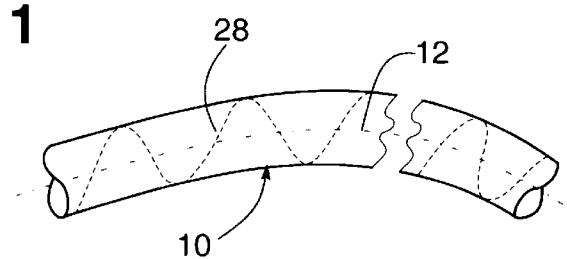
FIG. 1 is a schematic side elevation view of a segment of the magnetostrictive wire element associated with one embodiment of the present invention.

Referring now to the drawing, FIG. 1 shows a segment of an elongated wire 10 having an axis 12. Such wire 10 is made of an amorphous ferromagnetic alloy material having a composition $Fe_wB_xSi_yC_z$, as disclosed in U.S. Pat. No. 4,763,030 to Clark et al. aforementioned. The wire 10 is utilized as the magnetostrictive element applied to and/or mounted in a sensor environment, such as the torque sensor disclosed in U.S. Pat. No. 5,315,881 to Savage et al. aforementioned. In order to tailor the material of the magnetostrictive wire element 10 to a particular sensor application, it undergoes processing or treatment as hereinafter described with reference to FIG. 2, including annealing and magnetization.

The use of wire 10 in sensor applications, as compared to ribbon formations, offers better uniformity and accommodates annealing of much longer lengths of the magnetostrictive element. Moreover, in torque sensor applications as disclosed in the aforementioned Savage et al. patent, another degree of versatility is introduced by twisting of the wire 10 about its axis 12 during mounting. An increase in dynamic measurement range and sensitivity of the sensor is thereby achieved as a function of anisotropy resulting from the wire twisting.

Figure 2:
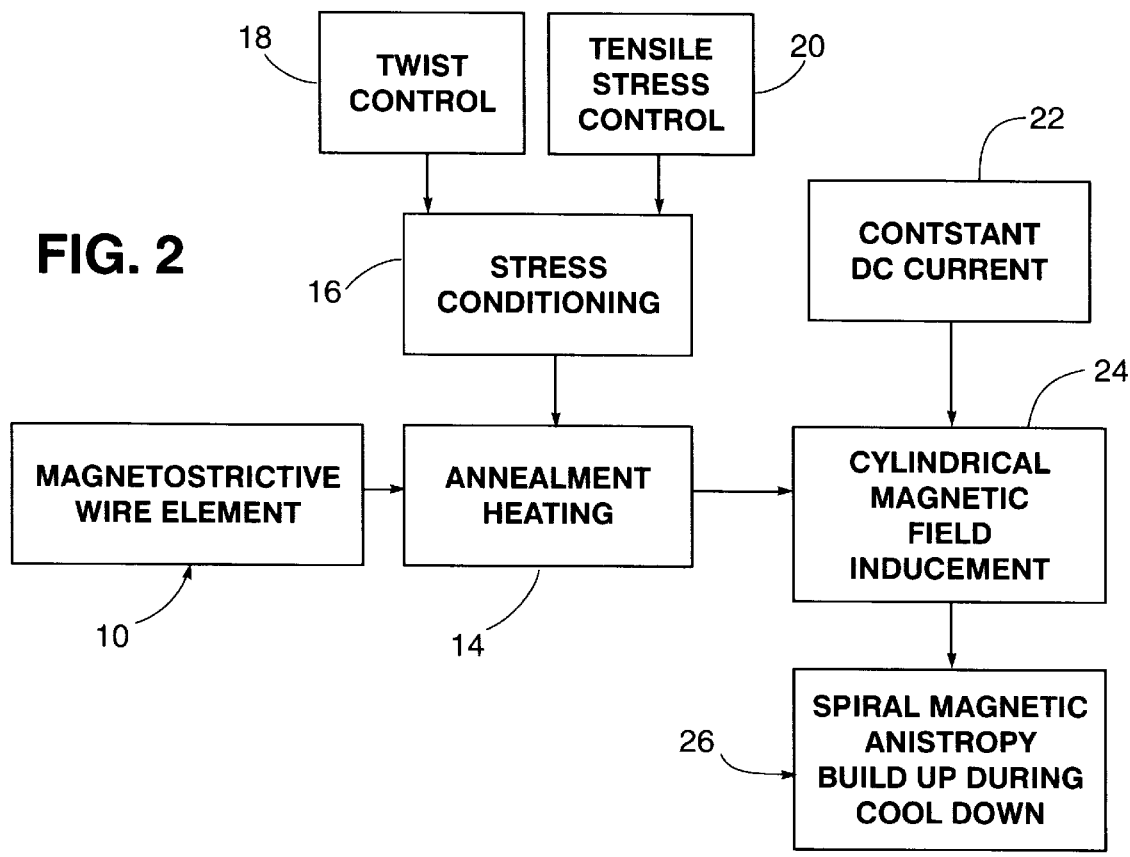
FIG. 2 is a block diagram depicting treatment of the wire element shown in FIG. 1, pursuant to the method or process of the present invention.

As diagrammed in FIG. 2, the wire 10 initially undergoes annealing by heating 14 within a furnace for example, to a temperature of typically 400° C. at which stresses induced within the wire during manufacture are removed. While being so annealed, a preselected stress condition 16 is imposed on the wire by applying thereto separately controlled amounts of twist 18 and tensile stress 20. In addition to annealment heating, a constant DC electrical current 22 is also applied to the wire while it is still undergoing annealment. The continued annealing of the wire in the presence of such electrical current results in the inducement of a magnetic field 24 inside the wire that is cylindrical relative to the wire axis 12. The continued presence of such magnetic field within the wire 10 while it undergoes the final step of cooldown 26, as diagrammed in FIG. 2, establishes the desired cylindrical or spiral magnetic anisotropy 28 as denoted in FIG. 1.

Obviously, other modifications and variations of the present invention may be possible in light of the foregoing teachings. It is therefore to be understood that within the scope of the appended claims the invention may be practiced otherwise than as specifically described.

What is claimed is:

1. In a method of treating an amorphous ferromagnetic magnetostrictive wire element which is under stress resulting from manufacture thereof, including the steps of: annealing the wire element and imparting magnetization thereto relative to an axis thereof prior to positioning of the wire element within a sensor; the improvement residing in: performing said step of annealing by heating of the wire element to a temperature at which said stress induced by said manufacture thereof is removed; performing said step of imparting magnetization by applying a DC electrical current to the wire element during said annealing thereof for producing a magnetic field in cylindrical relation to the axis of the wire element; and establishing a magnetic anistropy for the wire element during cooldown thereof from said temperature under said magnetic field.

2. The improvement as defined in claim 1, including the step of: introducing a stress condition to the wire element during said annealing thereof.

3. The improvement as defined in claim 2, wherein said step of introducing a stress condition comprises: applying twist and tensile stress to the wire element; and separately controlling the twist and the tensile stress selectively imposed on the wire element.

4. A method of treating a magnetostrictive wire element having an axis, prior to deformation during positioning of the wire element within a sensor, comprising the steps of: heating the wire element to an annealment temperature; and applying electrical current to the wire element during annealment by said heating to induce a magnetic field in cylindrical relation thereto about said axis thereof, whereby spiral magnetic anistropy is established during cooldown of the wire element from said annealment temperature.

5. The method as defined in claim 4, including the step of: selectively imposing twist and tensile stress on the wire element during said annealment thereof to establish a stress condition therein.

* * * * *